United States Patent [19]

Salugsugan et al.

[11] Patent Number: 5,702,563

[45] Date of Patent: Dec. 30, 1997

[54] REDUCED CHEMICAL-MECHANICAL POLISHING PARTICULATE CONTAMINATION

[75] Inventors: Isidore Salugsugan, Fremont; Diana M. Schonauer, San Jose, both of Calif.

[73] Assignee: Advanced Micro Devices, Inc., Sunnyvale, Calif.

[21] Appl. No.: 477,699

[22] Filed: Jun. 7, 1995

[51] Int. Cl.$^6$ ............................................. H01L 21/304
[52] U.S. Cl. .......................... 156/636.1; 437/228; 216/89; 216/91; 451/28
[58] Field of Search .................. 437/228; 156/636.1; 216/88, 89, 91; 451/28; 134/1, 1.3

[56] References Cited

U.S. PATENT DOCUMENTS

| 3,841,031 | 10/1974 | Walsh | 51/283 |
|---|---|---|---|
| 3,911,562 | 10/1975 | Youmans | 29/590 |
| 4,193,226 | 3/1980 | Gill, Jr. et al. | 51/124 R |
| 4,811,522 | 3/1989 | Gill, Jr. | 51/131 |
| 4,944,836 | 7/1990 | Beyer et al. | 156/645 |
| 5,093,279 | 3/1992 | Andreshak et al. | 437/173 |
| 5,245,794 | 9/1993 | Salugsugan | 51/165.74 |
| 5,262,354 | 11/1993 | Cote et al. | 437/195 |
| 5,380,401 | 1/1995 | Jones et al. | 134/1 |
| 5,527,424 | 6/1996 | Mullins | 156/636.1 |
| 5,531,861 | 7/1996 | Yu et al. | 156/636.1 |

OTHER PUBLICATIONS

"A New Damascene Structure for Submicrometer Interconnect Wiring," Joshi, IEEE Electron Device Letters, vol. 14, No. 3, Mar. 1993, pp. 129–132.

"Dual Damascene: A ULSI Wiring Technology," Kaanta et al., Jun. 11–12, 1991, VMIC Conference, IEEE, pp. 144–152.

"A Buried-Plate Trench Cell for a 64–Mb DRAM," Kenney et al., 1992 Symposium on VLSI Technology Digest of Technical Papers, pp. 14–15.

"Wafer Processing News—Post-CMP Cleanup Process Developed," Semiconductor International, Mar. 1995, p. 34.

"Chemical-mechanical polishing of interlayer dielectric: A review," Ali et al., Solid State Technology, Oct. 1994, pp. 63–68.

"Chemical-Mechanical Polishing for Fabricating Patterned W Metal Features as Chip Interconnects," Kaufman et al., J. Electrochem. Soc., vol. 138, No. 11, Nov. 1991, pp. 3460–3464.

*Primary Examiner*—John S. Chu
*Attorney, Agent, or Firm*—Lowe, Price, LeBlanc & Becker

[57] ABSTRACT

Particulate contamination of a semiconductor wafer subjected to chemical-mechanical polishing is reduced by applying a high pressure water spray to the polishing pad during conditioning.

35 Claims, 4 Drawing Sheets

REDUCED CHEMICAL-MECHANICAL POLISHING PARTICULATE CONTAMINATION

TECHNICAL FIELD

The present invention relates to a method and apparatus for chemical-mechanical polishing (CMP), particularly for conditioning a polishing pad.

BACKGROUND ART

Semiconductor integrated circuits are typically manufactured by forming an array of separate dies on a common semiconductor wafer. During processing, the semiconductor wafer is treated to form specified regions of insulating, conductive and semiconductor type materials. The ever increasing requirements for high density devices comprising wiring patterns with increasingly smaller distances between conductive lines poses a significant technological challenge. Conventionally, a conductive wiring pattern comprising a dense array of conductive lines is formed by depositing a metal layer, etching to form a conductive pattern and applying a dielectric material. Single and dual damascene techniques have also been employed to form openings in a dielectric layer which are subsequently filled with metal. The application of damascene techniques to the manufacture of semiconductor devices is disclosed in Joshi, "A New Damascene Structure for Submicrometer Interconnect Wiring," IEEE Electron Letters, Vol. 14, No. 3, March 1993, pp. 129–132; Kaanta et al., "Dual Damascene: A ULSI Wiring Technology," Jun. 11–12, 1991, VMIC Conference, IEEE, pp. 144–152; Kenny et al., "A Buried-Plate Trench Cell for a 64-Mb DRAM," 1992 Symposium on VLSI Technology Digest of Technical Papers, IEEE, pp. 14–15; U.S. Pat. No. 5,262,354; and U.S. Pat. No. 5,093,279. After formation of the wiring pattern, planarization is effected as by chemical-mechanical polishing. However, it is extremely difficult to uniformly planarize dense conductive patterns having interwiring spacings less than about 0.5 microns. It is also extremely difficult to planarize dielectric layers with vias having a minimal diameter, such as less than about 0.5 microns.

As shown in FIG. 1A, during an initial processing stage for forming an integrated circuit, a dielectric film 10 is deposited over a patterned conductive layer such as a metal 11. The object is to planarize steps 12 in dielectric layer 10 as shown in FIG. 1B. After deposition of layer 10, the portion thereof outside the trench must be removed. Such removal can be effected by plasma etching, or by a simplified faster and relatively inexpensive method known as chemical-mechanical planarization or polishing (CMP).

CMP is a conventional technique as disclosed in, for example, Salugsugan, U.S. Pat. No. 5,245,794; Beyer et al., U.S. Pat. No. 4,944,836; Youmans, U.S. Pat. No. 3,911,562. CMP is discussed in relation to earlier methods of fabricating metal interconnect structures by Kaufman et al., "Chemical-Mechanical Polishing for Fabricating Patterned W Metal Features as Chip Interconnects," J. Electrochem. Soc., Vol. 138, No. 11, November 1991, pp. 3460–3464. U.S. Pat. No. 4,193,226 and 4,811,522 to Gill, Jr. and U.S. Pat. No. 3,841,031 to Walsh relate to CMP apparatus. Various problems associated with CMP are discussed by Ali et al., "Chemical-mechanical polishing of interlayer dielectric: A review," Solid State Technology, October 1994, pp. 63–68.

Basically, in employing a conventional CMP apparatus, wafers to be polished are mounted on a carrier assembly placed on the CMP apparatus. A polishing pad is adapted to engage the wafers carried by the carrier assembly. A chemical agent containing an abrasive, typically a slurry, is dripped onto the pad continuously during the polishing operation while pressure is applied to the wafer via the carrier assembly.

A typical CMP apparatus 100 is shown in FIG. 2 and comprises a rotatable polishing platen 102, polishing pad 104 mounted on platen 102, driven by microprocessor control motor (not shown) to spin at about 10 to about 100 RPM. Wafer 106 is mounted on the bottom of a rotatable carrier assembly 108 so that a major surface of wafer 106 to be polished is positionable to contact the underlying polishing pad 104. Wafer 106 and carrier assembly 108 are attached to a vertical spindle 110 which is rotatably mounted in a lateral robotic arm 112 which rotates the carrier assembly 108 at about 10 to about 75 RPM in the same direction as platen 102 and radially positions the carrier assembly on the platen. Robotic arm 112 also vertically positions carrier assembly 108 to bring wafer 106 into contact with polishing pad 104 and maintain an appropriate polishing contact pressure. Carrier assemblies are available which accommodate a plurality of wafers. A tube 114 opposite carrier assembly 108 above polishing pad 104 dispenses and evenly saturates the pad with an appropriate polishing agent 116, typically a slurry.

As shown in FIG. 3, polishing pad 31 rotates in the direction of arrow 35, while carrier assembly 32 rotates in the direction of arrow 34, similar to the direction of arrow 35, but at a different speed than the polishing pad, while a downward force is applied to the carrier assembly 32 at 33 in a direction perpendicular to carrier assembly 32.

A polishing pad typically employed in a conventional CMP apparatus comprises a fibrous polymeric material, such as polyurethane and/or a polyester. One such type of fibrous polymeric polishing pad is IC 1000, commercially available in a pad set known IC 1000/SUBA4 from Rodel in Newark, Del. It is, however, extremely difficult to uniformly planarize a semiconductor wafer, particularly a semiconductor wafer having a maximum dimension less than about 0.5 microns, employing conventional CMP technology using a fibrous polymeric polishing pad.

The difficulty in achieving uniform planarization is a problem which is recognized in the semiconductor industry. Previous attempts to solve this problem focus upon improvements in consumable materials employed during CMP, such as the polishing pad and polishing agent, or improvements in the hardware itself, such as the CMP apparatus. One such attempt to achieve uniform planarization is a non-fibrous, polymeric polishing pad. Such a non-fibrous polymeric polishing pad can comprise a rigid molded polyurethane, cellular or non-cellular, and is preferably adhered to a closed cell foam sub-layer with an adhesive for mechanical stability. In such non-fibrous polymeric polishing pads comprising cellular polyurethane, pores facilitate transport of cleaning slurry to the semiconductor wafer. Another type of polyurethane comprises relatively non-porous, rigid, molded polyurethane having a plurality of concentric V- or U-shaped grooves, on the surface to effect transport of the polishing slurry to the semiconductor wafer. These types of polishing pads have proved successful in that a greater degree of planarization is achieved vis-à-vis fibrous polymeric polishing pads. It has been found that such non-fibrous polymeric polishing pads can achieve a degree of uniform planarization of 30% or greater than that achieved using fibrous polymeric polishing pads. Moreover, such non-fibrous polymeric pads exhibit greater stability than fibrous polymeric polishing pads.

However, upon experimentation, it was found that CMP with non-fibrous polymeric polishing pads results in the disadvantageous contamination of the semiconductor wafer by adhering and/or embedded particulate material, such as silicon dioxide, generated during CMP. The difficulty of removing adhering and/or embedded particles from the surface of a semiconductor wafer is recognized in the art. See, for example, "Wafer Processing News—Post-CMP Cleanup Process Developed" Semiconductor International, March 1995, pg. 34, reporting a technique for cleaning the polished semiconductor wafer with a deionized water rinse under high pressure.

There exists in the semiconductor industry a need for a simplified effective way to reduce surface contamination of a semiconductor wafer by adhering and/or embedded particles resulting from CMP, particularly from wafers subjected to CMP using a non-fibrous polymeric polishing pad, thereby enabling the obtainment of uncontaminated uniformly planarized surfaces on a semiconductor wafer.

DISCLOSURE OF THE INVENTION

An object of the present invention is a CMP apparatus and method for uniformly planarizing a semiconductor wafer employing a non-fibrous polymeric polishing pad without contaminating the semiconductor wafer with particles.

Another object of the present invention is an apparatus and method for conditioning a non-fibrous polymeric polishing pad to reduce particulate contamination of a semiconductor wafer during CMP.

Additional objects, advantages and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

According to the present invention, the foregoing and other objects are achieved in part by a method of conditioning a non-fibrous polymeric polishing pad of a CMP apparatus, which conditioning method comprises applying a pressurized spray of water to the surface of the polishing pad.

Another aspect of the present invention is the method of sequentially planarizing a plurality of semiconductor wafers, which method comprises: CMP wafers on a non-fibrous polymeric polishing pad; and periodically conditioning the polishing pad by applying a pressurized spray of water to the surface of the polishing pad.

Another aspect of the present invention is a CMP apparatus comprising: a non-fibrous polymeric polishing pad; and means for conditioning the polishing pad, which conditioning means comprises means for applying a high pressure water spray to the surface of the polishing pad.

A further aspect of the present invention is a method of conditioning a non-fibrous polymeric polishing pad of a chemical-mechanical polishing apparatus, which conditioning method comprises dispensing water to the surface of the polishing pad at a flow rate of about 0.25 to about 0.75 liters/min.

Yet another aspect of the present invention is a method of sequentially planarizing a plurality of semiconductor wafers, which method comprises: chemical-mechanical polishing the wafers on a non-fibrous polymeric polishing pad; and periodically conditioning the polishing pad by dispensing water to the surface of the polishing pad at a flow rate of about 0.25 to about 0.75 liters/min.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1A:
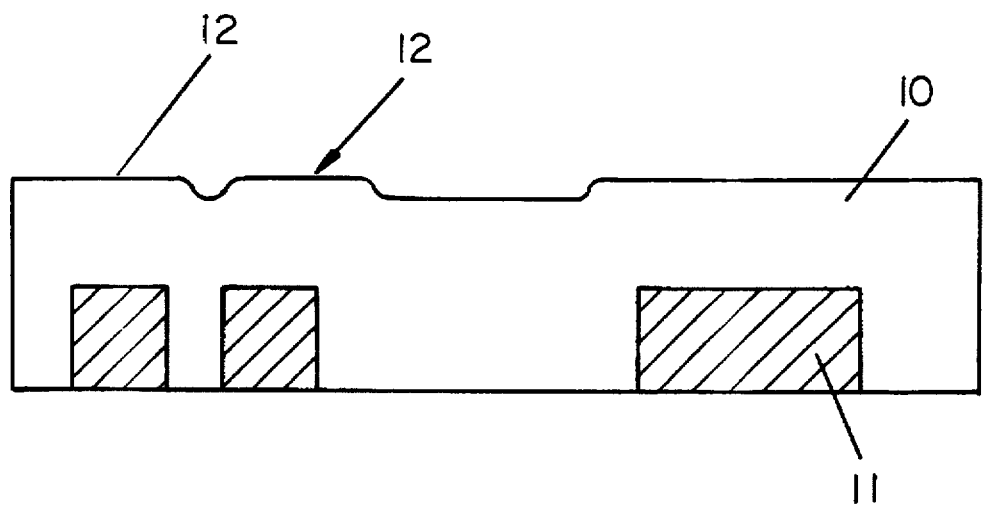
FIG. 1A schematically illustrates a covered pattern prior to planarization.
Figure 1B:
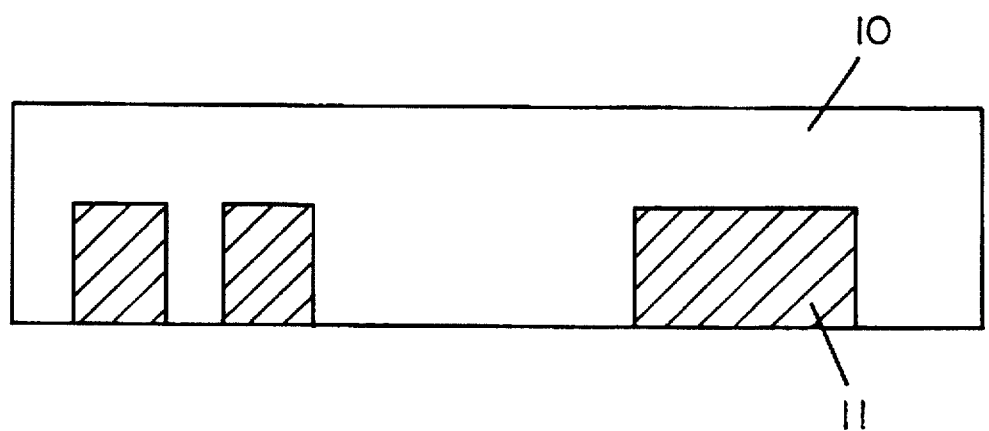
FIG. 1B schematically illustrates a planarized pattern.
Figure 2:
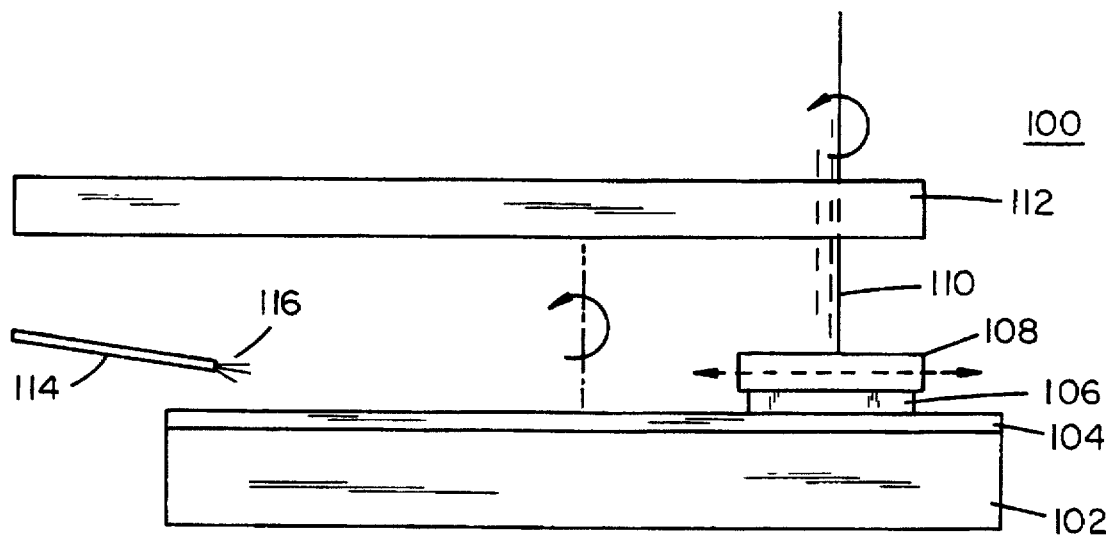
FIG. 2 schematically illustrates a typical CMP apparatus.
Figure 3:
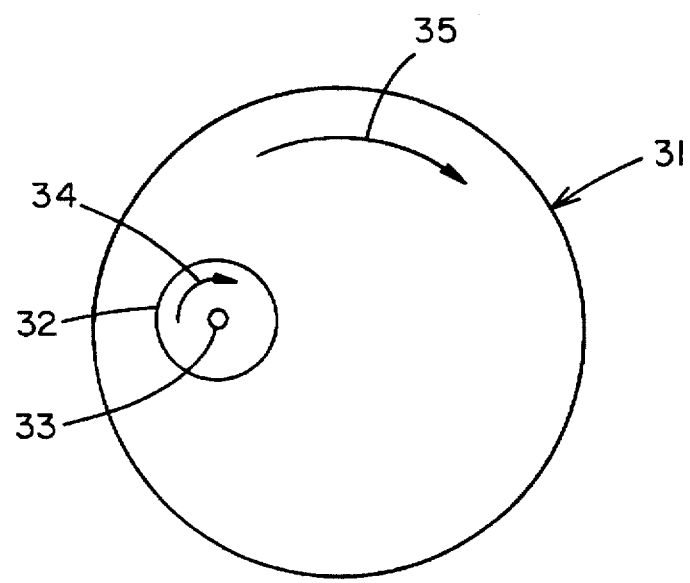
FIG. 3 schematically illustrates a typical CMP arrangement.

The present invention is directed to the problem of contamination in the form of particulate material adhering to and/or embedded in the surface of a wafer planarized by CMP, particularly a wafer planarized by CMP employing a non-fibrous polymeric polishing pad, most particularly a non-fibrous polymeric polishing pad containing a plurality of concentric V- or U-shaped grooves on its surface. Typical CMP comprises a polishing phase during which a portion of a layer on a semiconductor substrate, typically a patterned layer such as a patterned insulation or conductive layer, is removed, desirably at a high removal rate by abrasion. The wafer subjected to CMP is then conventionally buffed and usually cleaned with appropriate chemicals. It was found that as a result of CMP, particulate material, typically silicon dioxide, presumably solidified slurry employed during CMP, adheres to and/or embeds in the surface of the semiconductor wafer. Upon investigation, it was found that this particulate material ranges in size from about 0.27 microns to about 50 microns and larger.

Conventional practices comprise conditioning the polishing pad intermittently between CMP operations in order to regenerate the roughness of the surface of the polishing pad. During CMP, the surface roughness of the polishing pad decreases, thereby reducing the abrasiveness of the polishing pad and the amount of slurry capable of being transferred to the wafer undergoing CMP, thereby adversely affecting the polishing rate and the nonuniformity of oxide removed from the planarized surface. Conditioning the polishing pad between CMP operations is intended to overcome this problem. A conventional conditioning operation comprises applying an abrasive diamond grit wheel under pressure to the surface of the polishing pad while dispensing a CMP slurry thereon.

After extensive experimentation and investigation, it was discovered that the amount of particulate material undesirably adhering to and/or embedded in a semiconductor wafer subjected to CMP with a non-fibrous polymeric polishing pad, particularly one containing a plurality of concentric V-shaped grooves or U-shaped grooves, can be dramatically reduced by applying water to the surface of the polishing pad during conditioning. The water can be applied to the surface of the polishing pad during conditioning by dispensing it at a suitable flow rate, such as about 0.25 to about 0.75 liters/min., preferably 0.5 liter/min. It is a preferred embodiment of the present invention to apply a high pressure water spray to the surface of the polishing pad during conditioning. In accordance with the preferred embodiment of the present invention, the pressurized water applied during conditioning of the polishing pad is ultrapure water, most preferably deionized water. As used throughout this disclosure, including the application and claims, the expression "ultrapure water" denotes water having a resistivity equal to or greater than 18 megaohms cm.

The pressurized water can be applied by any conventional means capable of delivering the requisite pressure, such as spray nozzles or jets. The amount of pressure applied should be sufficient to remove as many adhering and/or embedded particles as possible from the surface of the non-fibrous polymeric polishing pad. The water pressure in a particular situation can be easily optimized by routine experimentation. Typically, it has been found that a pressure of about 30 to about 150 psi is effective, preferably about 90 to about 110 psi, most preferably about 100 psi. Conditioning can be conducted at temperatures typically employed during conditioning cycles; however, it was found that ambient temperature is sufficient. In a preferred aspect, conditioning of the surface of the non-fibrous polymeric polishing pad is conducted with a conventional abrasive diamond grit wheel typically employed during a conditioning cycle.

The mechanistic cause of the particulate contamination and the precise manner in which such particulate contamination is reduced by the present invention is not completely understood. While not wishing to be bound by any particular theory, it is believed that when employing a fibrous polymeric polishing pad, Si—O bonds formed at a high pH at the wafer surface are continuously broken and the reaction products swiped away during polishing. However, non-fibrous polymeric polishing pads, particularly those containing a plurality of concentric V-shaped grooves in the polishing surface, presents a different problem. Due to the physical nature of such non-fibrous polymeric polishing pads, silica, i.e., solidified slurry, builds up continuously, particularly in the concentric V-shaped grooves. During planarization by CMP, it is believed that particles of built up silica redeposit on highly active areas, such as the semiconductor wafer surface, during CMP. The application of water to the surface of the polishing pad during conditioning, preferably pressurized water, particularly ultrapure water, is unexpectedly effective in preventing the accumulation of large amounts of silica on the surface, particularly in the grooves, of a non-fibrous polymeric polishing pad, and/or removing a sufficient amount of such accumulated silica to significantly reduce the amount of silica redeposited on a semiconductor wafer surface during CMP.

The present invention is applicable to any conventional CMP process and/or conditioning cycle involving any type of non-fibrous polymeric polishing pad, preferably a non-fibrous polymeric polishing pad containing a plurality of V-shaped concentric grooves in the polishing surface. Conventional polymeric materials comprise rigid polyurethane, cellular or non-cellular.

In accordance with the present invention, a conventional CMP apparatus and conditioning means are modified by providing means to dispense, preferably to apply a high pressure water spray. Such means can include any conventional means capable of applying water at an elevated pressure, for example, about 30 to about 150 psi, such as a water spray bar comprising a plurality of high pressure spray jets.

The present invention can be practiced employing otherwise conventional CMP techniques and apparatus. The present invention can be employed for the planarization of various types of surfaces on a semiconductor wafer, including conductive and insulating materials, such as oxides, nitrides, polysilicon, single crystalline silicon, amorphous silicon, and mixtures thereof, and doped insulating materials. The substrate of the wafer containing the conductive or non-conductive material is generally a semiconductor material, such as silicon.

Figure 4:
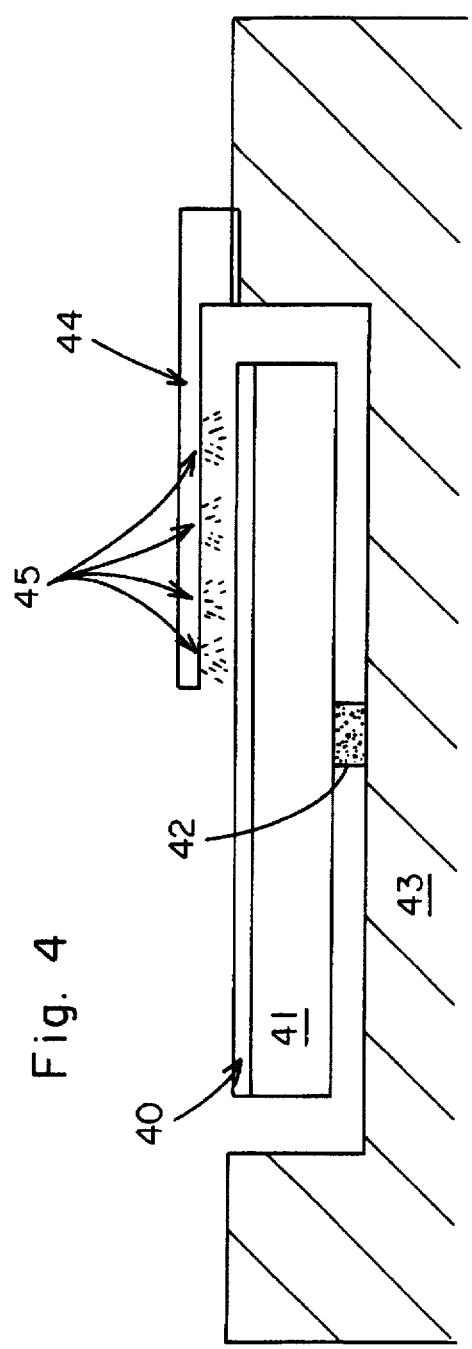
FIG. 4 illustrates an embodiment of the present invention.

The use of high pressure water sprays in accordance with the present invention is illustrated in FIG. 4 wherein a non-fibrous polymeric polishing pad 40 is positioned on rotating platen 41 mounted on axle 42 extending from structural frame 43 of conventional CMP apparatus. In accordance with the present invention, appropriate high pressure means is provided so that, during the conditioning cycle, the polishing surface of the non-fibrous polymeric polishing pad is cleansed with high pressure water sprays, preferably ultrapure water, most preferably deionized water. In the embodiment depicted in FIG. 4, a high pressure water spray bar 44 is provided which contains a plurality of high pressure spray jets 45 for applying high pressure water sprays to the surface of the non-fibrous polymeric polishing pad.

Figure 5:
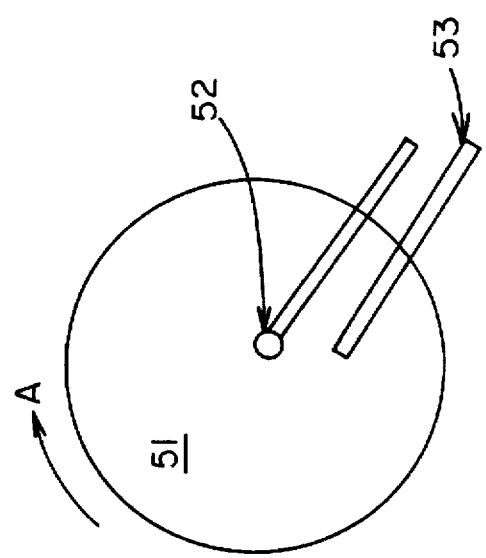
FIG. 5 illustrates another embodiment of the present invention.

Another embodiment of the present invention is depicted in FIG. 5 wherein non-fibrous polymeric polishing pad 51, rotating in the direction of arrow A, is conditioned, during a conditioning cycle, with a conventional abrasive diamond grit wheel 52. In accordance with the present invention, during conditioning, rather than employing a slurry which is simply dispensed onto the surface of the polishing pad, high pressure means 53 is provided, similar to the high pressure spray bar 44 and containing spray jets 45 depicted in FIG. 4, for applying high pressure water to the surface of the non-fibrous polymeric polishing pad during conditioning.

EXAMPLE

To demonstrate the effectiveness of the present invention employing high pressure water spray to reduce particulate contamination, comparison testing was conducted involving a typical fibrous polymeric polishing pad and a non-fibrous polymeric polishing pad. In addition, the non-fibrous polymeric polishing pad was conditioned under various process conditions. The non-fibrous polymeric polishing pad was made of rigid polyurethane having a compressibility of 4.3% and a stiffness of 4.3%. The surface was provided with a plurality of concentric V-shaped grooves machined by a lathe. The grooves were about 0.012" deep with a pitch of about 0.030". The non-fibrous polymeric polishing pad was provided with a closed cell foam sub-layer bonded thereto with an adhesive for mechanical stability and to reduce a slurry penetration between the pad therebetween. The comparison testing comprised conditioning the polishing pad and conducting conventional CMP on wafers. A pre-wet phase was employed in order to ensure slurry on the pad prior to polishing.

Figure 6:
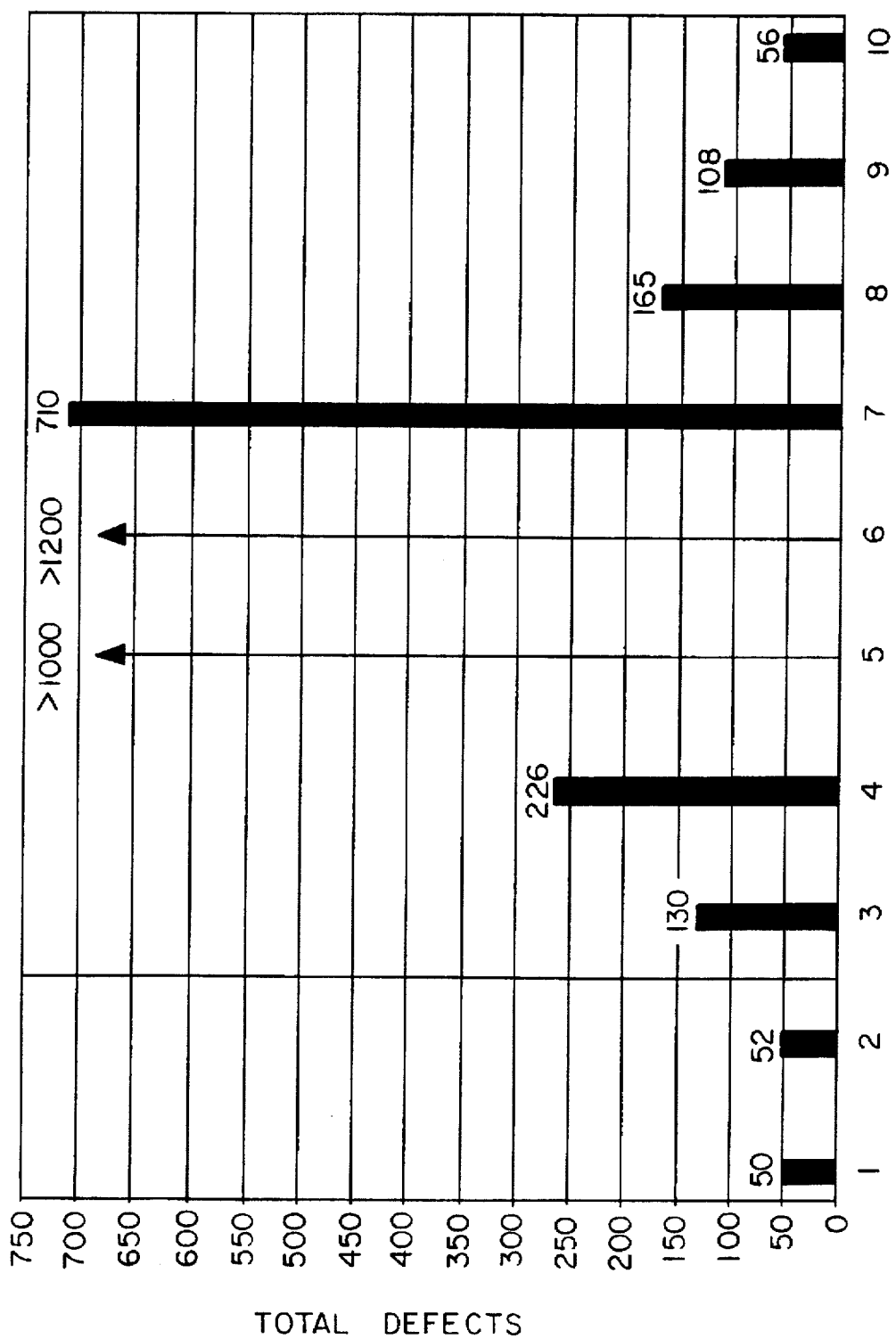
FIG. 6 is a graph showing the results of experimentation.

The reported results represent the particulate contamination of semiconductor wafers subjected to CMP polishing employing the conditioned polishing pad. Except where otherwise specified, the conditioning conditions where those conventionally employed during diamond conditioning of a polishing pad, i.e., about 7 lbs. psi, for about 90 seconds at ambient temperature. The results are depicted in FIG. 6, wherein the total amount of particulate contamination is reported for each Run in terms of number of defects, i.e., particles. In each of the Runs, the defects were counted on a commercially available wafer scanner, the ESTEK 8500 particle system.

Control Runs 1 and 2 involve conditioning of a conventional fibrous polymeric polishing pad, the IC 1000/SUBA4 pad set marketed by Rodel of Newark, Del. As depicted, the control Runs involving conditioning the fibrous polymeric polishing pad had a defect count of 50 and 52.

In Runs 3 through 10, the non-fibrous polymeric polishing pad was employed. Control Run 3 involved the conventional diamond wheel conditioning. The number of reported defects is 130.

Run 4 involved conditioning the polishing pad with a CMP slurry marketed by Rodel, with a resulting defect count of 265.

The polishing pad of Run 5 did not undergo conditioning. A defect count of over 4000 was reported.

Run 6 was conducted at a reduced pressure of 4 lbs. for 50 seconds, with a resulting particle count excess of 1200.

Run 7 was conducted at a reduced pressure of 4 psi for a lengthened period of 140 seconds with a resulting particle count of 710.

Run 8 was conducted at an elevated pressure of 12 lbs. for 50 seconds, with a resulting particle count of 168.

Run 9 was conducted at an elevated pressure of 12 lbs. for 140 seconds, with a resulting particle count of 105.

Run 10, representing an embodiment of the present invention, was conducted with a high pressure ultrapure water spray otherwise under normal diamond conditioning conditions and achieved a reduced particle count of 55.

Thus, it is apparent from the above example, that the use of a high pressure ultrapure water spray during the conditioning cycle of a non-fibrous polymeric polishing pad dramatically reduces the number of particles adhering to and/or embedded in the surface of a semiconductor wafer subjected to CMP employing the non-fibrous polymeric polishing pad.

The present invention is applicable to a wide variety situations which require planarization during the course of manufacturing a semiconductor device. Such situations include planarization of a patterned insulating layer and/or patterned conductive layer, and planarization of doped and undoped insulating layers.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A method of sequentially planarizing a plurality of semiconductor wafers, which method comprises:
   chemical-mechanical polishing the wafers on a non-fibrous polymeric polishing pad comprising at least one groove in its polishing surface; and
   applying a pressurized spray of water to the surface of the polishing pad to substantially remove silica from the groove during periodic conditioning of the polishing pad intermittently between chemical-mechanical polishing operations;
   wherein the non-fibrous polymeric polishing pad comprises at least one concentric groove in its polishing surface.

2. The method according to claim 1, wherein the polishing pad is adhered to a closed cell foam sub-layer with an adhesive.

3. The method according to claim 1, wherein the polishing pad comprises non-fibrous polyurethane.

4. The method according to claim 1, wherein the polishing pad comprises cellular polyurethane.

5. The method according to claim 3, wherein the polishing pad comprises molded polyurethane.

6. The method according to claim 1, wherein the non-fibrous polymeric polishing pad comprises a plurality of concentric V- or U-shaped grooves on its polishing surface and the pressurized spray of water substantially removes silica from the grooves.

7. The method according to claim 1, further comprising buffing with an abrasive diamond grit wheel during conditioning.

8. The method according to claim 1, wherein the polishing pad is conditioned at about ambient temperature.

9. The method according to claim 1, comprising applying a pressurized spray of ultrapure water to the surface of the polishing pad.

10. The method according to claim 9, comprising applying the ultrapure water at a pressure of about 30 to about 150 psi.

11. The method according to claim 10, comprising applying the ultrapure water at a pressure of about 90 to about 110 psi.

12. The method according to claim 11, comprising applying the ultrapure water at a pressure of about 100 psi.

13. The method according to claim 9, wherein the ultrapure water is deionized water.

14. The method according to claim 1, comprising conditioning the polishing pad after chemical-mechanical polishing each wafer.

15. The method according to claim 1, comprising planarizing one or more semiconductor wafers having an insulating pattern.

16. The method according to claim 1, comprising planarizing one or more semiconductor wafers having a conductive pattern.

17. The method of sequentially planarizing a plurality of semiconductor wafers, which method comprises:
   chemical-mechanical polishing the wafers on a non-fibrous polymeric polishing pad comprising at least one groove in its polishing surface; and
   dispensing water to the surface of the polishing pad at a flow rate of about 0.25 to about 0.75 liters/min to substantially remove silica from the groove during periodic conditioning of the polishing pad intermittently between chemical-mechanical polishing operations,
   wherein the non-fibrous polymeric polishing pad comprises a plurality of concentric V- or U-shaped grooves on its polishing surface, and the dispensed water substantially removes silica from the grooves.

18. The method according to claim 17, wherein the flow rate is about 0.5 liter/min.

19. The method according to claim 17, wherein the polishing pad comprises non-fibrous polyurethane.

20. The method according to claim 17, further comprising buffing with an abrasive diamond grit wheel during conditioning.

21. The method according to claim 17, comprising dispensing ultrapure water to the surface of the polishing pad.

22. The method according to claim 17, wherein the silica comprises solidified polishing slurry.

23. A method of sequentially planarizing a plurality of semiconductor wafers, which method comprises:

chemical-mechanical polishing the wafers on a non-fibrous polymeric polishing pad comprising at least one groove in its polishing surface; and applying a pressurized spray of ultrapure water to the surface of the polishing pad at a pressure of about 90 to about 110 psi to substantially remove silica from the groove during periodic conditioning of the polishing pad intermittently between chemical-mechanical polishing operations.

24. The method according to claim 23, wherein the polishing pad is adhered to a closed cell foam sub-layer with an adhesive.

25. The method according to claim 23, wherein the polishing pad comprises non-fibrous polyurethane.

26. The method according to claim 23, wherein the polishing pad comprises cellular polyurethane.

27. The method according to claim 25, wherein the polishing pad comprises molded polyurethane.

28. The method according to claim 23, further comprising buffing with an abrasive diamond grit wheel during conditioning.

29. The method according to claim 23, wherein the polishing pad is conditioned at about ambient temperature.

30. The method according to claim 23, comprising applying the ultrapure water at a pressure of about 100 psi.

31. The method according to claim 23, wherein the ultrapure water is deionized water.

32. The method according to claim 23, comprising conditioning the polishing pad after chemical-mechanical polishing each wafer.

33. The method according to claim 23, comprising planarizing one or more semiconductor wafers, wherein the non-fibrous polymeric polishing pad comprises at least one concentric groove in its polishing surface.

34. The method according to claim 23, wherein one or more semiconductor wafers comprises an insulating pattern.

35. The method according to claim 23, wherein one or more semiconductor wafers comprises a conductive pattern.

* * * * *

UNITED STATES PATENT AND TRADEMARK OFFICE
CERTIFICATE OF CORRECTION

PATENT NO. : 5,702,563
DATED : December 30, 1997
INVENTOR(S) : Isi SALUGSUGAN et al.

It is certified that error appears in the above-identified patent and that said Letters Patent is hereby corrected as shown below:

On the the title page, item [75] should read as follows:

--[75] Inventors: Isi Salugsugan, Fremont; Diana M. Schonauer, San Jose, both of Calif.--

Signed and Sealed this

Fourteenth Day of April, 1998

Attest:

BRUCE LEHMAN

*Attesting Officer*     *Commissioner of Patents and Trademarks*